United States Patent
Park et al.

(10) Patent No.: US 8,227,092 B2
(45) Date of Patent: Jul. 24, 2012

(54) ORGANIC ELECTROLUMINESCENT DEVICE

(75) Inventors: Jong-Jin Park, Yongin-si (KR); Yu-Jin Kim, Suwon-si (KR); Sang-Hoon Park, Seongnam-si (KR); Jhun-Mo Son, Yongin-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 1118 days.

(21) Appl. No.: 11/633,005

(22) Filed: Dec. 4, 2006

(65) Prior Publication Data

US 2007/0178331 A1 Aug. 2, 2007

(30) Foreign Application Priority Data

Jan. 27, 2006 (KR) .................. 10-2006-0009032

(51) Int. Cl.
*H01L 51/54* (2006.01)
(52) U.S. Cl. ........ 428/690; 428/917; 313/504; 313/506; 257/40; 257/102; 257/E51.043; 252/301.16
(58) Field of Classification Search .............. 428/690, 428/917; 313/504, 506; 252/301.16, 519.2, 252/582; 532/51, 54, 55
See application file for complete search history.

(56) References Cited

U.S. PATENT DOCUMENTS

| | | | | |
|---|---|---|---|---|
| 5,643,685 | A * | 7/1997 | Torikoshi | 428/690 |
| 5,656,252 | A * | 8/1997 | Tuel et al. | 423/705 |
| 5,869,199 | A | 2/1999 | Kido | |
| 5,917,279 | A | 6/1999 | Elschner et al. | |
| 6,447,934 | B1 | 9/2002 | Suzuki et al. | |
| 2003/0129451 | A1 * | 7/2003 | Nukada et al. | 428/690 |
| 2003/0160235 | A1 * | 8/2003 | Hirai | 257/40 |

FOREIGN PATENT DOCUMENTS

| | | |
|---|---|---|
| JP | 1997-148071 | 6/1997 |
| JP | 1998-199681 | 7/1998 |
| JP | 1999-307267 | 11/1999 |
| JP | 2002-252089 | 9/2002 |

OTHER PUBLICATIONS

Young Kwan Kim et al., "Size dependence of electroluminescence of nanoparticle (rutile-$TiO_2$) dispersed MEH-PPV films", Synthetic Metals 111-112 (2000) 207-211.

* cited by examiner

*Primary Examiner* — Jennifer Chriss
*Assistant Examiner* — Michael H Wilson
(74) *Attorney, Agent, or Firm* — Robert E. Bushnell, Esq.

(57) ABSTRACT

Provided is an organic electroluminescent device including an organic layer interposed between a pair of electrodes, the organic layer including a layer formed of a titanium oxide derivative or a mixture layer containing a titanium oxide derivative. The organic electroluminescent device has higher luminescent efficiency, a longer lifetime and a lower operating voltage than a conventional organic electroluminescent device, and can be easily manufactured.

18 Claims, 1 Drawing Sheet

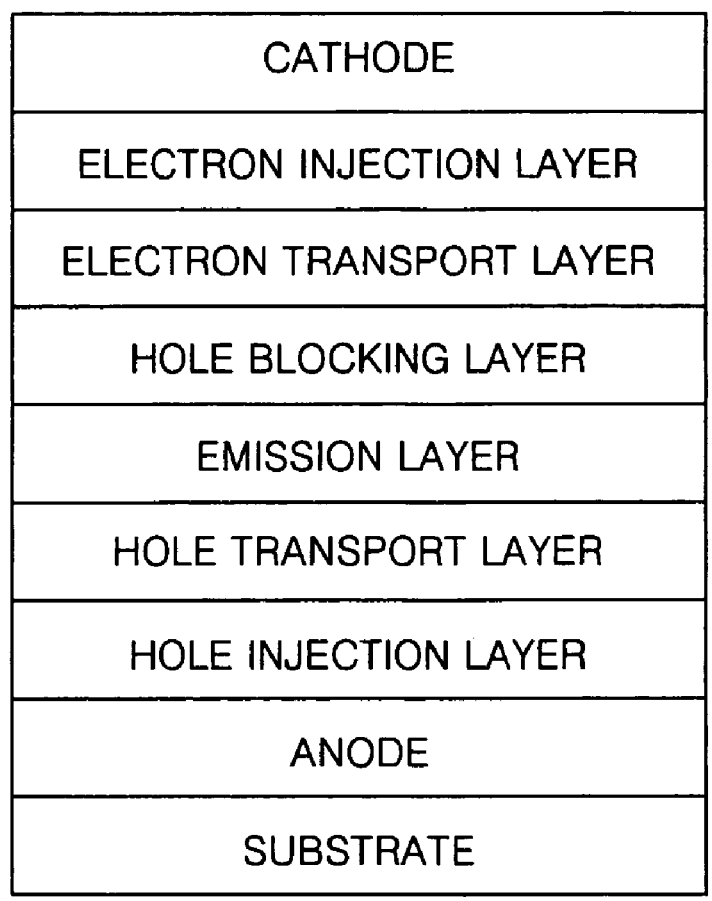

ORGANIC ELECTROLUMINESCENT DEVICE

CROSS-REFERENCE TO RELATED PATENT APPLICATIONS AND CLAIM OF PRIORITY

This application claims the benefit of Korean Patent Application No. 10-2006-0009032, filed on Jan. 27, 2006, in the Korean Intellectual Property Office, the disclosure of which is incorporated herein in its entirety by reference.

BACKGROUND OF THE INVENTION

1. Field of the Invention

The present invention relates to an organic electroluminescent device, and more particularly, to an organic electroluminescent device including an organic layer interposed between a pair of electrodes, wherein the organic layer includes a titanium oxide derivative layer or a layer doped with a titanium oxide derivative so as to obtain higher luminescent efficiency and longer lifetime than a conventional organic electroluminescent device.

2. Description of the Related Art

Organic electroluminescent devices are self-emissive devices in which when a current is provided to a fluorescent or phosphorescent organic layer, electrons and holes are combined together in the organic layer, thereby emitting light. Organic electroluminescent devices are lightweight, and can be relatively easily manufactured using a small amount of components. In addition, organic electroluminescent devices can realize high-quality images, have wide viewing angles, and can realize moving pictures. Furthermore, organic electroluminescent devices can realize high color purity at low power consumption and a low operating voltage, and are thus suitable for portable electronic devices and large-scale screens.

In 1987, Tang and VanSlyke of Eastman Kodak Co. in the USA developed a stack-type thin film device that showed a luminosity of 1000 cd/m$^2$ or more at a low operating voltage of 10 V or less. This development became thereafter a basis for organic EL research. In this patent, high luminosity can be realized by decreasing a thickness of all of the organic layers to about 130 nm through deposition of an emissive layer having an electron transporting capability and a hole transport layer, and by improving electron injection efficiency by including an Mg.Ag alloy having a low work function in a cathode.

Generally, an organic layer of an organic electroluminescent device is not formed of an emissive layer alone. Instead, the organic layer of an organic electroluminescent device has a multi-layer structure including, for example, an electron injection layer, an emissive layer, and a hole transport layer etc, to obtain higher efficiency and a lower operating voltage. For example, Japanese Patent Laid-open Publication No. 2002-252089 discloses an organic electroluminescent device including a hole transport layer.

In order to improve luminescent efficiency of an organic electroluminescent device, a charge balance application method, a charge generation layer, and TiO$_2$ nanoparticles etc. were introduced. For example, U.S. Pat. No. 5,869,199 discloses an organic electroluminescent device including a triazole layer, and U.S. Pat. No. 6,447,934 discloses an organic electroluminescent device including two emissive layers interposed between a pair of electrodes. In addition, it was reported that use of TiO$_2$ nanoparticles increase luminescent efficiency of a device, and a multi-layer device in which TiO$_2$ nanoparticles are dispersed showed higher luminosity and luminescent efficiency than a mono-layer polymer device (Synthetic Metals 111-112, 2000. 207-211). However, TiO$_2$ nanoparticles must be uniformly dispersed to obtain a uniform layer.

SUMMARY OF THE INVENTION

The present invention provides an organic electroluminescent device that includes a uniform layer formed using a liquid state titanium oxide derivative. The organic electroluminescent device of the present invention has much higher luminescent efficiency and a longer lifetime than a conventional organic electroluminescent device, and can be easily and economically manufactured using a liquid state titanium oxide derivative.

According to an aspect of the present invention, there is provided an organic electroluminescent device including: a pair of electrodes; and an organic layer interposed between the pair of electrodes, the organic layer comprising: at least one layer selected from the group consisting of a hole injection layer, a hole transport layer, an emission layer, and an electron transport layer; and a layer formed of a titanium oxide derivative on or between said at least one layer. According to another aspect of the present invention, there is provided an organic electroluminescent device including: a pair of electrodes; and an organic layer interposed between the pair of electrodes, the organic layer comprising a layer doped with a titanium oxide derivative.

According to still another aspect of the present invention, there is provided an organic electroluminescent device including: an organic electroluminescent device, comprising: a pair of electrodes; and an organic layer interposed between the pair of electrodes, the organic layer comprising a layer formed of a titanium oxide derivative represented by Formulae 1 through 4:

where $R_1$ is each independently CH$_3$CO—CH=CCH$_3$—, C$_2$H$_5$OCO—CH=CCH$_3$—, —CH$_3$CH—COO$^-$NH4$^+$, —COR$_2$, —CO(C$_6$H$_4$)COOR$_3$, or a C$_1$-C$_{12}$ alkyl group;
$R_2$ is a substituted or unsubstituted C$_1$-C$_{12}$ alkyl group; and
$R_3$ is a substituted or unsubstituted C$_1$-C$_{12}$ alkyl group;

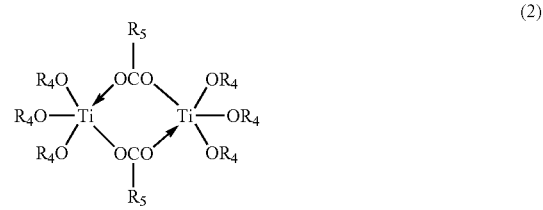

where $R_4$ is a substituted or unsubstituted C$_1$-C$_{12}$ alkyl group; and
$R_5$ is a substituted or unsubstituted C$_1$-C$_{12}$ alkyl group;

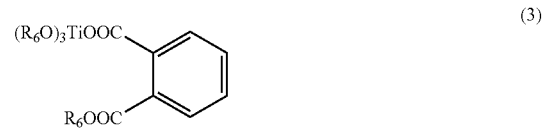

where $R_6$ is a substituted or unsubstituted $C_1$-$C_{12}$ alkyl group; and

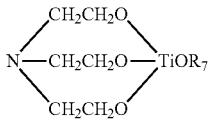

where $R_7$ is a substituted or unsubstituted $C_1$-$C_{12}$ alkyl group.

BRIEF DESCRIPTION OF THE DRAWINGS

The above and other features and advantages of the present invention will become more apparent by describing in detail exemplary embodiments thereof with reference to FIG. 1, which is a sectional view of an organic electroluminescent device according to an embodiment of the present invention.

DETAILED DESCRIPTION OF THE INVENTION

The present invention will now be described in detail by explaining embodiments of the invention with reference to FIG. 1.

An organic electroluminescent device according to an embodiment of the present invention has high luminescent efficiency and a long lifetime, and can be easily and economically manufactured.

The organic electroluminescent device according to the embodiment of the present invention includes an organic layer interposed between a pair of electrodes, in which the organic layer includes a layer formed by coating a titanium oxide derivative solution or includes a layer doped with a titanium oxide derivative.

The titanium oxide derivative may be represented by one of Formulae 1 through 4:

$$Ti(OR_1)_4 \quad (1)$$

where $R_1$ is $CH_3CO-CH=CCH_3-$, $C_2H_5OCO-CH=CCH_3-$, $-CH_3CH-COO^-NH_4^+$, $-COR_2$, $-CO(C_6H_4)COOR_3$, or a $C_1$-$C_{12}$ alkyl group; where $R_2$ is a substituted or unsubstituted $C_1$-$C_{12}$ alkyl group; and $R_3$ is a substituted or unsubstituted $C_1$-$C_{12}$ alkyl group;

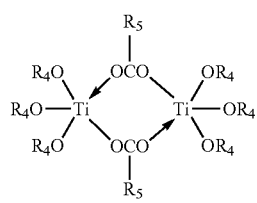

where $R_4$ is a substituted or unsubstituted $C_1$-$C_{12}$ alkyl group; and $R_5$ is a substituted or unsubstituted $C_1$-$C_{12}$ alkyl group;

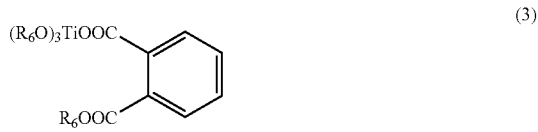

where $R_6$ is a substituted or unsubstituted $C_1$-$C_{12}$ alkyl group; and

where $R_7$ is a substituted or unsubstituted $C_1$-$C_{12}$ alkyl group.

The titanium oxide derivative represented by one of Formulae 1, 2, 3 and 4 may be, but is not limited to, tetraisopropyl titanate, tetra-n-butyl titanate, tetrakis(2-ethylhexyl)titanate, acetylacetonate titanate chelate, ethyl acetoacetate titanate chelate, triethanolamine titanate chelate, lactic acid titanate chelate ammonium salt, or the like.

The substituted or unsubstituted $C_1$-$C_{12}$ alkyl group used in the present embodiment is an alkyl group having at least one hydrogen atom substituted with a halogen atom, a hydroxy group, a nitro group, a cyano group, a substituted or unsubstituted amino group ($-NH_2$, $-NH(R)$, $-N(R')(R'')$ where R' and R'' are each independently a $C_1$-$C_{10}$ alkyl group), an amidino group, a hydrazine group, a hydrazone group, a carboxyl group, a sulfonic acid group, a phosphoric acid group, a $C_1$-$C_{20}$ alkyl group, a $C_1$-$C_{20}$ halogenated alkyl group, a $C_2$-$C_{20}$ alkenyl group, a $C_2$-$C_{20}$ alkynyl group, a $C_1$-$C_{20}$ hetero alkyl group, a $C_6$-$C_{20}$ aryl group, a $C_6$-$C_{20}$ arylalkyl group, a $C_6$-$C_{20}$ heteroaryl group, or a $C_6$-$C_{20}$ heteroarylalkyl group.

In the organic electroluminescent device according to the embodiment of the present invention, organic layers interposed between the pair of electrodes includes at least one layer selected from a hole injection layer, a hole transport layer, an emissive layer, and an electron transport layer.

According to an embodiment of the present invention, the titanium oxide derivative can be coated between these organic layers as a separate layer, or these organic layers can be doped with the titanium oxide derivative.

That is, an organic layer, such as a hole injection layer, a hole transport layer, an emissive layer, or an electron transport layer can be doped with the titanium oxide derivative. For example, when an emissive layer is doped with the titanium oxide derivative, the emissive layer containing the titanium oxide derivative may have a thickness of 10 nm to 100 nm. When the thickness of the emissive layer is less than 10 nm, the lifetime of the organic electroluminescent device may be reduced, whereas when the thickness of the emissive layer is greater than 100 nm, the operating voltage of the organic electroluminescent device increases.

Alternatively, the titanium oxide derivative can be formed into a layer. That is, the titanium oxide derivative can be coated as a separate layer between organic layers, such as a hole injection layer, a hole transport layer, an emissive layer, or an electron transport layer. That is, it means that the titanium oxide derivative can be formed in addition to a hole injection layer, a hole transport layer, an emissive layer, and/or an electron transport layer. The titanium oxide derivative can be formed into a layer. Such a coating layer can be formed using a conventional wet coating method including spin coating and drying processes. In another embodiment of the present invention, a titanium oxide derivative is formed into a layer, and then the prepared layer is transferred by thermal deposition, laser deposition, heat bar, magnetic induction heating, or ultrasonic friction.

A solution of the titanium oxide derivative can be prepared using a solvent selected from alcohols, aromatic groups, dimethyl formamid, acetone, and a mixture of these. However, the solvent is not limited thereto. A concentration of the solution of the titanium oxide derivative in the organic electroluminescent device may be in the range of 1 wt % to 90 wt %.

A material used to form the hole injection layer of the organic electroluminescent device according to an embodiment of the present invention is not limited. For example, examples of such a material include copper phthalocyanine (CuPc); a starburst-type amine, such as TCTA, m-MTDATA, IDE406 (commercially available from Idemitsu Inc.), polyaniline/dodecylbenzenesulfonic acid (Pani/DBSA), or poly(3,4-ethylenedioxythiophene)/poly(4-styrenesulfonate) (PEDOT/PSS); and the like. However, the material used to form the hole injection layer is not limited thereto.

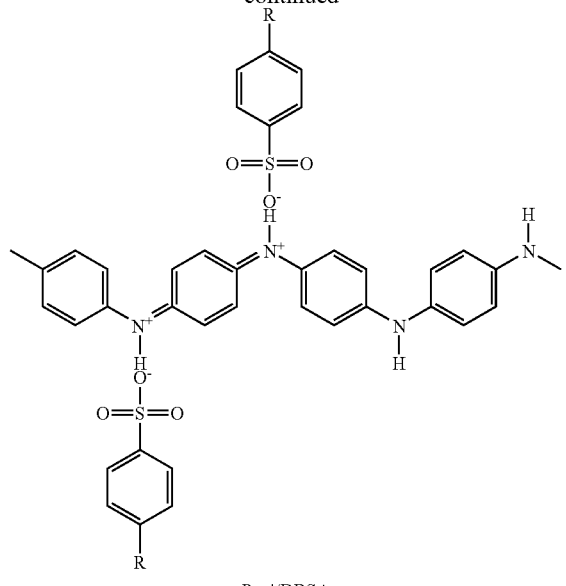

Pani/DBSA

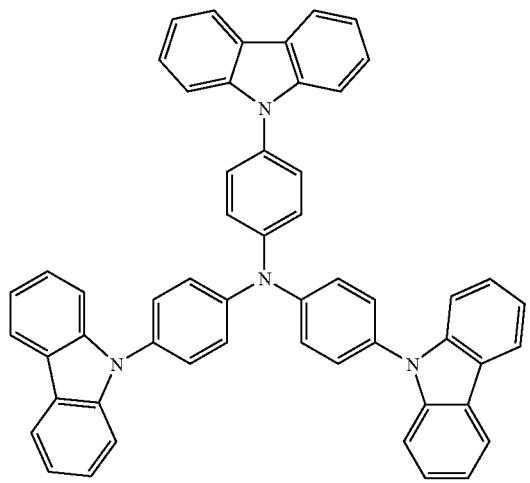

TCTA

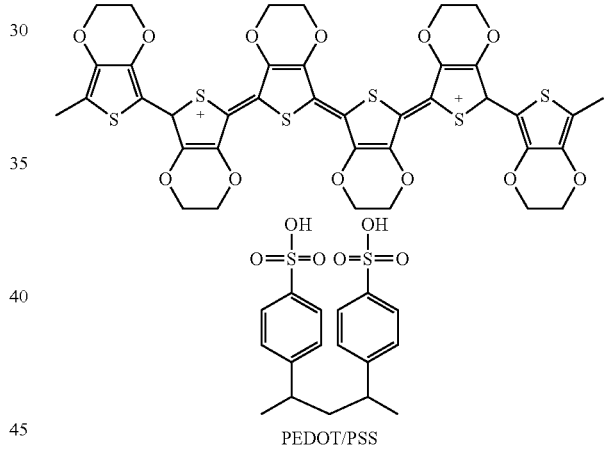

PEDOT/PSS

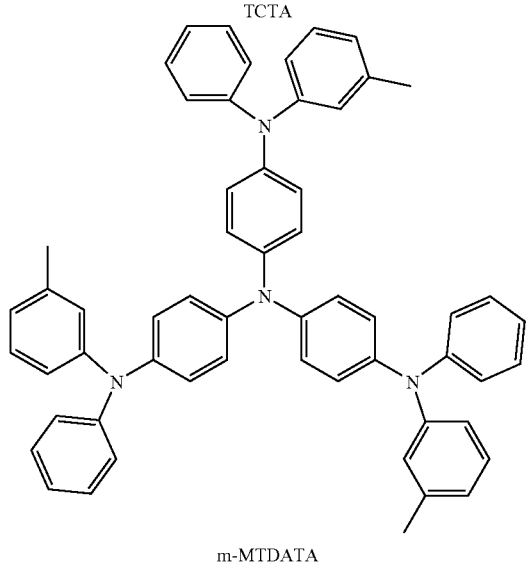

m-MTDATA

A material used to form the hole transport layer of the organic electroluminescent device according to an embodiment of the present invention is not limited. For example, examples of such a material include 1,3,5-tricarbazolylbenzene, 4,4'-biscarbazolylbiphenyl, polyvinylcarbazole, m-biscarbazolylbenzene, 4,4'-biscarbazolyl-2,2'-dimethylbiphenyl, 4,4',4"-tri( N-carbazolyl )triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'diamine(TPD), N,N'-di(naphthalene-1-yl)-N,N'-diphenyl benzidine(α-NPD), N,N'-diphenyl-N,N'-bis(1-naphthyl)-(1,1'-biphenyl)4,4'-diamine(NPB), IDE320 (commercially available from Idemitsu Inc.), poly(9,9-dioctylfluorene-co-N-(4-butylphenyl)diphenylamine) (TFB), poly(9,9-dioctylfluorene-co-bis-(4-butylphenyl-bis-N,N-phenyl-1,4-phenylenediamine)) (PFB), and the like. However, the material used to form the hole transport layer is not limited thereto.

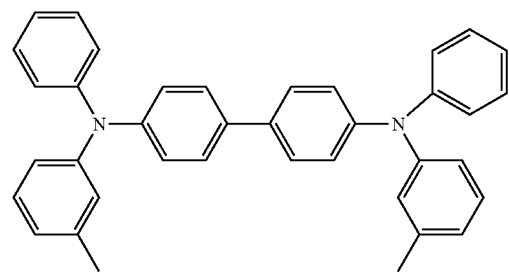

TPD

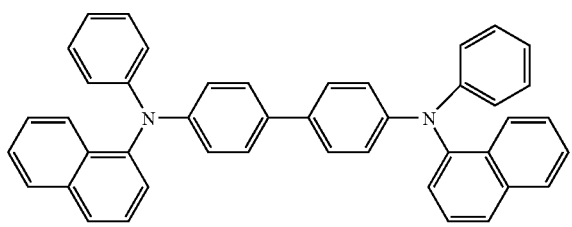

α-NPD

A material used to form the emissive layer of the organic electroluminescent device according to an embodiment of the present invention is not limited. Examples of a material used to form a red emissive layer include DCM1, DCM2, Eu(thenoyltrifluoroacetone)₃ (Eu(TTA)₃), dicyanomethylene-2-butyl-6-(1,1,7,7,-tetramethyljulolidyl-9-enyl)-4H-pyran(DCJTB), and the like. Meanwhile, the red emissive layer can be formed using various methods. For example, Alq₃ can be doped with a dopant such as DCJTB; Alq₃ and rubrene are co-deposited and then doped with a dopant; or 4,4'-N-N'-dicarbazole-biphenyl (CBP) can be doped with a dopant such as BTPIr.

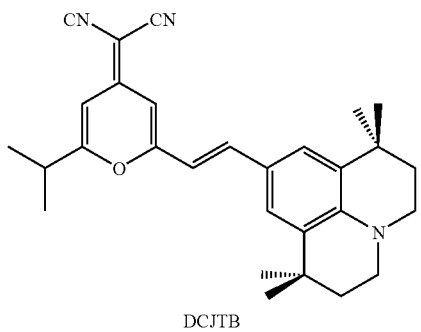

DCJTB

A green emissive layer can be formed using, for example, coumarin 6, C545T, quinacridone, Ir(ppy)₃, or the like. In addition, the green emissive layer can be formed using various methods. For example, CBP can be used using a dopant such as Ir(ppy)₃, or a host such as Alq₃ and a dopant such as a coumarin-based material can be used. The coumarin-based material can be C314S, C343S, C7, C7S, C6, C6S, C314T, or C545T.

C314S

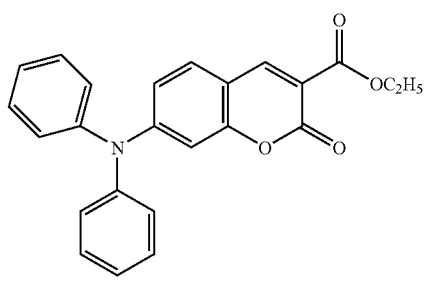

C343S

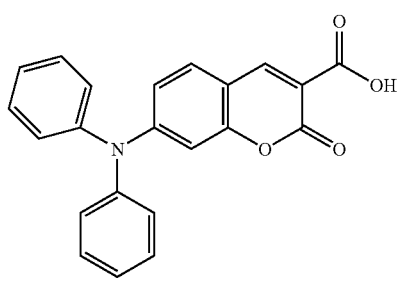

C7

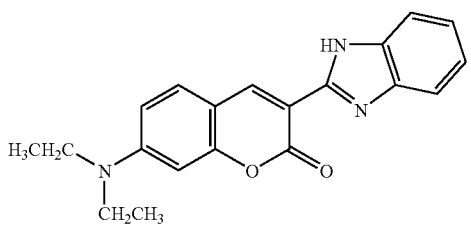

C7S

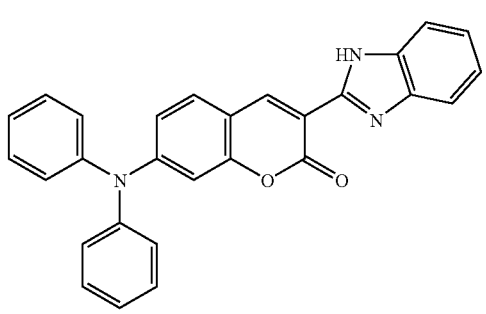

C6S

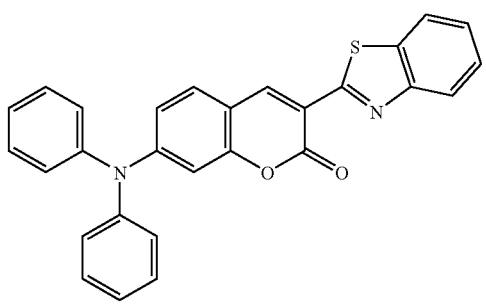

C314T

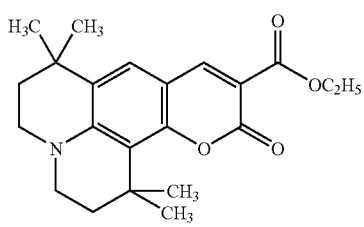

C545T

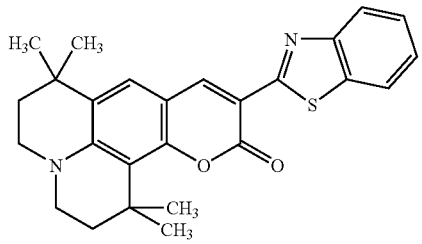

A blue emissive layer can be formed using, for example, oxadiazole dimer dyes (Bis-DAPOXP)), spiro compounds (Spiro-DPVBi, Spiro-6P), triarylamine compounds, bis(styryl)amine(DPVBi, DSA), Compound(A), bis[2-(4,6-difluorophenyl)pyridinato-N,$C^{2'}$] iridium picolinate (FIrpic), CzTT, anthracene, 1,1,4,4-tetraphenyl-1,3-butadiene (TPB), 3,5,3',5'-tetrakis-tert-butyldiphenoquione; 1,2,3,4,5-pentaphenyl-1,3-cyclopentadiene (PPCP), DST, TPA, OXD-4, BBOT, AZM-Zn, BH-013X (commercially available from Idemitsu Inc.) which is an aromatic hydrocarbon compound containing a naphthalene moiety, or the like. The blue emissive layer can be formed using various methods. For example, IDE140 (commercially available from Idemitsu Inc.) can be used with a dopant such as IDE105 (commercially available from Idemitsu Inc.).

FIrpic

CzTT

PPCP

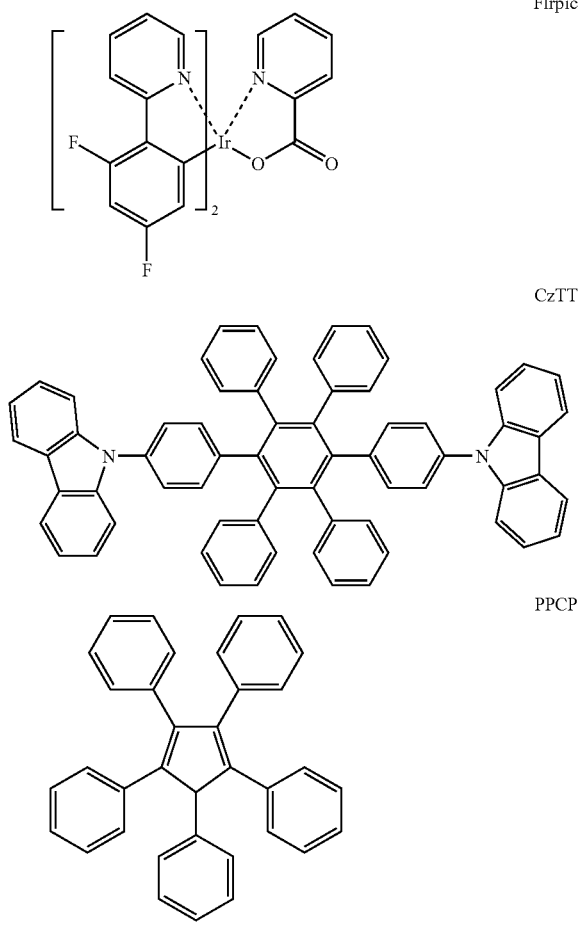

DST

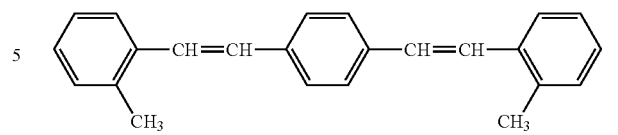

TPA

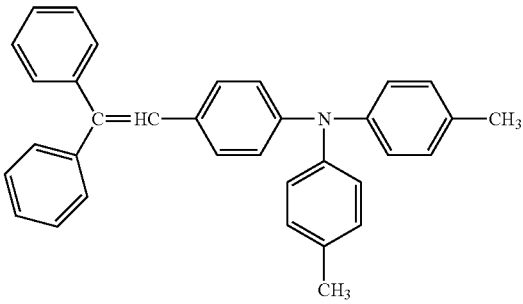

Spiro-DPVB

Compound (A)

Anthracene

TPB

OXD-4

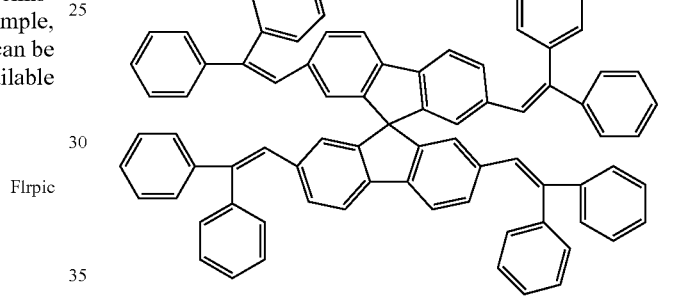

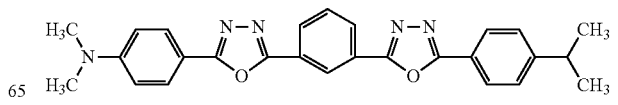

BBOT

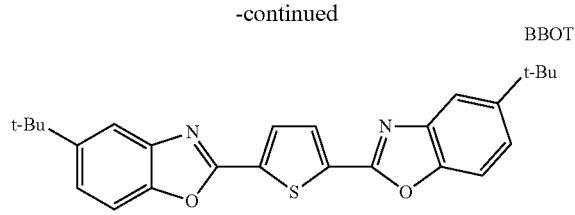

AZM-Zn

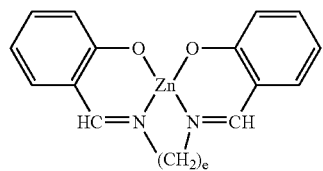

The thickness of the emissive layer may be in the range of 100 Å to 1000 Å, preferably 100 Å to 500 Å. Meanwhile, the red, green, and blue emissive layers may have the same or different thicknesses. When the thickness of the emissive layer is less than 100 Å, the lifetime of the organic electroluminescent device may be reduced. On the other hand, when the thickness of the emissive layer is greater than 1000 Å, the driving voltage of the organic electroluminescent device may be increased significantly.

A material used to form an electron transport layer of the organic electroluminescent device according to an embodiment of the present invention is not limited and can be $Alq_3$.

The thickness of the electron transport layer may be in the range of 100 Å to 400 Å, preferably 250 Å to 350 Å. When the thickness of the electron transport layer is less than 100 Å, electrons can be transported very quickly so that a charge balance can be broken. On the other hand, when the thickness of the electron transport layer is greater than 400 Å, the driving voltage of the device can be increased.

Hereinafter, an organic electroluminescent device according to an embodiment of the present invention, and a method of manufacturing the same will now be described with reference to FIG. 1. FIG. 1 is a sectional view of an organic electroluminescent device according to an embodiment of the present invention.

First, an anode is formed on a substrate. The substrate can be any substrate that is commonly used in an organic electroluminescent device. For example, the substrate can be a glass substrate or a plastic substrate, both of which are transparent and waterproof, have plane surfaces, and can be easily handled. The anode can be a reflective electrode formed using a highly conductive metal, such as lithium (Li), magnesium (Mg), aluminum (Al), aluminum-lithium (Al—Li), calcium (Ca), magnesium-indium (Mg—In), magnesium-silver (Mg—Ag), calcium (Ca)-aluminum(Al), aluminum (Al)-ITO, or the like.

Subsequently, a hole injection layer (HIL) and a hole transport layer (HTL) are sequentially formed on the anode by vacuum thermal deposition or spin coating, and then an emissive layer (EML) including blue, red, and green emissive layers is formed on the HTL.

Then a hole blocking material is vacuum deposited or spin coated on the emissive layer to selectively form a hole blocking layer (HBL). The hole blocking material is not limited and can be any material that has an electron transporting capability and higher ionization potential than luminescent compounds used to form the emissive layer (EML). Examples of the hole blocking material may include bis(2-methyl-8-quinolato)-(p-phenylphenolato)-aluminum (Balq), bathocuproine (BCP), and tris(N-arylbenzimidazole) (TPBI), etc.

The thickness of the hole blocking layer (HBL) may be in the range of 30 Å to 60 Å, preferably 40 Å to 50 Å. When the thickness of the hole blocking layer (HBL) is less than 30 Å, it is difficult to block holes. On the other hand, when the thickness of the hole blocking layer is greater than 60 Å, the operating voltage of the organic electroluminescent device can be increased.

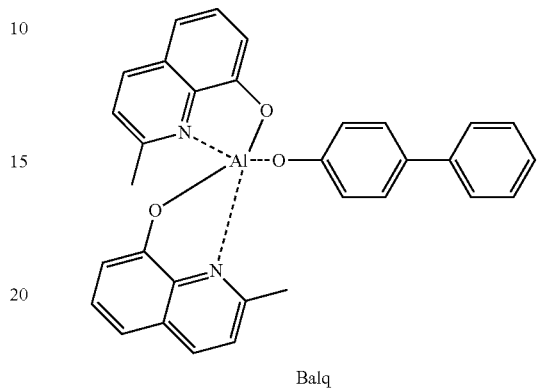

Balq

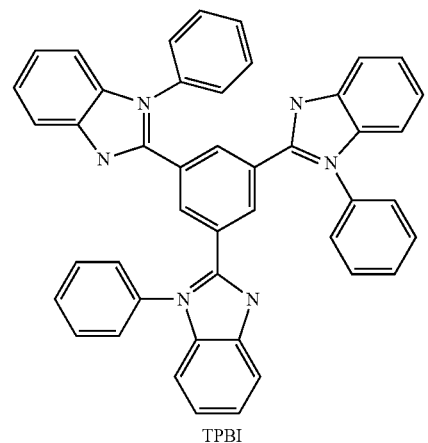

TPBI

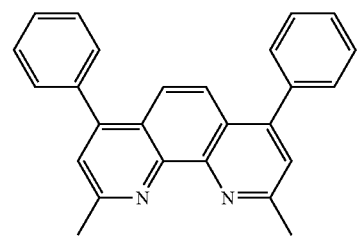

BCP

An electron transporting material can be vacuum deposited or spin coated on the emissive layer (EML) or the hole blocking layer (HBL) to selectively form an electron transport layer (ETL). Then, a material used to form an electron injection layer (EIL) can be vacuum deposited or spin coated on the emissive layer (EML), the hole blocking layer (HBL), or the electron transport layer (ETL). The material used to form the electron injection layer (EIL) can be $BaF_2$, LiF, NaCl, CsF, $Li_2O$, BaO, or the like, but is not limited thereto.

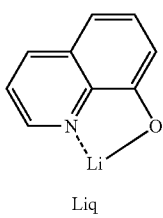

Liq

The thickness of the electron injection layer (EIL) may be in the range of 2 Å to 10 Å, preferably 2 Å to 5 Å, and more preferably 2 Å to 4 Å. When the thickness of the electron injection layer (EIL) is less than 2 Å, the electron injection efficiency may decrease. On the other hand, when the thickness of the electron injection layer (EIL) is greater than 10 Å, the operating voltage of the organic electroluminescent device may increase.

The organic electroluminescent device according to the embodiment of the present invention can be used in various kinds of flat panel display devices, for example, a passive organic electroluminescent display device and an active organic electroluminescent display device. When an active organic electroluminescent display device includes the organic electroluminescent device according to the embodiment of the present invention, the anode can be electrically connected to a source electrode or drain electrode of a thin film transistor.

The present invention will be described in further detail with reference to the following examples. These examples are for illustrative purposes only and are not intended to limit the scope of the present invention.

EXAMPLES

Example 1

Titanium Oxide Derivative Coated on Emissive Layer

A 1,300 Å-thick substrate (aluminum and ITO)(commercially available from SDI Co. Ltd.) used as a reflective anode was cut to a size of 50 mm×50 mm×0.7 mm. The prepared substrate was ultrasonically cleaned in isopropyl alcohol for 5 minutes, ultrasonically cleaned in pure water for 5 minutes, cleaned using ultraviolet (UV) rays for 30 minutes, and then cleaned using ozone. Then a hole injection layer having a thickness of 1,000 Å was formed on the anode using m-TDATA that was used as a hole injecting material. Subsequently, NPB that was used as a hole transporting material was deposited on the hole injection layer to form a hole transport layer having a thickness of 1,200 Å. Then, CBP and bis[2-(2'-benzothienyl)-pyridinato-N,$C^{3'}$] iridium (BPTIr) that were used as red luminescent materials were deposited on the hole transport layer to form an emissive layer having a thickness of 300 Å.

Meanwhile, 10 g of a titanium oxide derivative, tetraisopropyl titanate, was dissolved in 100 g of butanol to prepare a solution of the titanium oxide derivative. The prepared solution was spin coated on the emissive layer to a thickness of 30 nm.

Then, Balq was deposited on the emissive layer to form a hole blocking layer having a thickness of 50 Å. $Alq_3$ was deposited on the hole blocking layer to form an electron transport layer having a thickness of 250 Å. LiF was deposited on the electron transport layer to form an electron injection layer having a thickness of 3 Å. Then Mg:Ag was deposited on the electron injection layer to form a cathode having a thickness of 100 Å. As a result, an organic electroluminescent device was manufactured.

Example 2

Titanium Oxide Derivative Doped in Emissive Layer

An organic electroluminescent device in which a titanium oxide derivative was contained in the emissive layer was manufactured having the following structure: ITO/PEDOT (500 Å)/emissive layer(700 Å)/Ba(50 Å)/Al(2,000 Å). In order to prepare an anode (positive electrode), an ITO glass substrate (15Ω/$cm^2$ ,1500 Å) commercially available from Corning Co. was cut to a size of 50 mm×50 mm×0.7 mm, and then was ultrasonically cleaned in isopropyl alcohol for 5 minutes, ultrasonically cleaned in pure water for 5 minutes, cleaned using ultraviolet (UV) rays for 30 minutes, and then cleaned using ozone. Then, a polymer solution of PEDOT/PSS (product name: Al 4083, commercially available from Bayer Co.) that was used as a hole injecting material was spin coated on the anode to a thickness of 500 Å. Subsequently, 1 g of a green 223 used as a green luminescent material (commercially available from Dow Inc.) dissolved in 10 g of toluene was mixed with 1 g of tetra-n-butyltitanate used as a titanium oxide derivative dissolved in 10 g of butanol. The prepared mixed solution was spin coated to a thickness of 700 Å to form an emissive layer. Subsequently, Ba was deposited on the emissive layer to a thickness of 50 Å to form an electron injection layer, and then Al was deposited thereon to a thickness of 1500 Å. As a result, an organic electroluminescent device was manufactured.

Example 3

Titanium Oxide Derivative Coated on Electron Transport Layer

A 1300 Å-thick substrate (aluminum and ITO)(commercially available from SDI Co. Ltd.) used as a reflective anode was cut to a size of 50 mm×50 mm×0.7 mm. The prepared substrate was ultrasonically cleaned in isopropyl alcohol for 5 minutes, ultrasonically cleaned in pure water for 5 minutes, cleaned using ultraviolet (UV) rays for 30 minutes, and then cleaned using ozone. Then, a hole injection layer having a thickness of 1000 Å was formed on the anode using m-TDATA that was used as a hole injecting material. Subsequently, NPB that was used as a hole transporting material was deposited on the hole injection layer to form a hole transport layer having a thickness of 1200 Å. Then, CBP and BPTIr that were used as red luminescent materials were deposited on the hole transport layer to form an emissive layer having a thickness of 300 Å. Balq was deposited on the emissive layer to form a hole blocking layer having a thickness of 50 Å, and then $Alq_3$ was deposited on the hole blocking layer to form an electron transport layer having a thickness of 250 Å.

Meanwhile, 10 g of tetrakis(2-ethylhexyl)titanate was dissolved in 100 g of butanol to prepare a solution of a titanium oxide derivative, and then the prepared solution was spin coated on the electron transport layer to a thickness of 30 nm.

Subsequently, Mg:Ag was deposited thereon to a thickness of 100 Å to form a cathode. As a result, an organic electroluminescent device was manufactured.

Comparative Example 1

An organic electroluminescent device was manufactured in the same manner as in Example 1, except that the tetraisopropyltitanate that was used as a titanium oxide derivative was not coated on the emissive layer.

Comparative Example 2

An organic electroluminescent device was manufactured in the same manner as in Example 2, except that the tetra-n-butyltitanate that was used as a titanium oxide derivative was not mixed with the green 223.

Comparative Example 3

An organic electroluminescent device was manufactured in the same manner as in Example 3, except that the tetrakis (2-ethylhexyl)titanate that was used as a titanium oxide derivative was not spin coated on the electron transport layer.

TABLE 1

|  | Operating (Turn-on) Voltage/ Voltage at 100 cd/m² (V) | Maximum Luminescent Efficiency (cd/A) | Lifetime |
|---|---|---|---|
| Example 1 | 2.3/3.0 | 10.3 @ 6.8 V | 105 khr@1000 cd/m² |
| Example 2 | 2.7/3.7 | 20.2 @ 6.3 V | 1820 hr@1000 cd/m² |
| Example 3 | 2.6/3.0 | 5.1 @ 6.5 V | 99 khr@1000 cd/m² |
| Comparative Example 1 | 3.1/6.0 | 7.8 @ 6.3 V | 58 khr@1000 cd/m² |
| Comparative Example 2 | 3.2/5.0 | 11.0 @ 7.6 V | 430 hr@1000 cd/m² |
| Comparative Example 3 | 3.3/6.2 | 2.1 @ 6.8 V | 55 khr@1000 cd/m² |

As shown in Table 1, the organic electroluminescent devices prepared according to Examples 1 through 3 has a lower operating voltage, higher maximum luminescent efficiency, and longer lifetime than the organic electroluminescent devices prepared according to Comparative Examples 1 through 3 which respectively correspond to Examples 1 through 3.

According to the embodiments of the present invention, an organic electroluminescent device that has higher luminescent efficiency, longer lifetime and a lower operating voltage than a conventional organic electroluminescent device can be easily manufactured.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic electroluminescent device, comprising:
a pair of electrodes; and
an organic layer interposed between the pair of electrodes, the organic layer comprising:
at least one layer selected from the group consisting of a hole injection layer, a hole transport layer, an emission layer, and an electron transport layer; and
a titanium oxide derivative layer consisting of 100% of a titanium oxide derivative represented by Formulae 1 through 4 formed on said at least one layer as a separate layer;

$$Ti(OR_1)_4 \quad (1)$$

where $R_1$ is each independently $CH_3CO-CH=CCH_3-$, $C_2H_5OCO-CH=CCH_3-$, $-CH_3CH-COO^-NH4^+$, $-COR_2$, $-CO(C_6H_4)COOR_3$, or a $C_1$-$C_{12}$ alkyl group;

$R_2$ is a substituted or unsubstituted $C_1$-$C_{12}$ alkyl group; and
$R_3$ is a substituted or unsubstituted $C_1$-$C_{12}$ alkyl group;

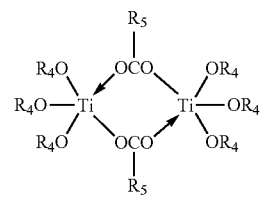

(2)

where $R_4$ is a substituted or unsubstituted $C_1$-$C_{12}$ alkyl group; and $R_5$ is a substituted or unsubstituted $C_1$-$C_{12}$ alkyl group;

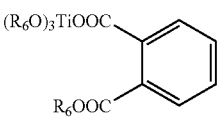

(3)

where $R_6$ is a substituted or unsubstituted $C_1$-$C_{12}$ alkyl group; and

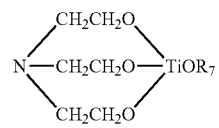

(4)

where $R_7$ is a substituted or unsubstituted $C_1$-$C_{12}$ alkyl group.

2. The organic electroluminescent device of claim 1, wherein the titanium oxide derivative is selected from the group consisting of tetraisopropyl titanate, tetra-n-butyl titanate, tetrakis(2-ethylhexyl)titanate, acetylacetonate titanate chelate, ethyl acetoacetate titanate chelate, triethanolamine titanate chelate, lactic acid titanate chelate ammonium salt, and a mixture thereof.

3. The organic electroluminescent device of claim 1, wherein the titanium oxide derivative layer is formed using a solution of 1 wt % to 90 wt % of the titanium oxide derivative dissolved in a solvent selected from the group consisting of alcohols, aromatic groups, dimethyl formamid, acetone, and a mixture thereof.

4. The organic electroluminescent device of claim 1, wherein the organic layer further comprises at least one layer selected from the group consisting of a hole blocking layer, an electron injection layer, and an electron blocking layer.

5. The organic electroluminescent device of claim 1, wherein the titanium oxide derivative layer is prepared by using a wet coating method comprising spin coating and a drying process, or by transferring a prepared titanium oxide derivative film using thermal deposition, laser deposition, heat bar, magnetic induction heating, or ultrasonic friction.

6. An organic electroluminescent device, comprising:
a pair of electrodes; and
an organic layer interposed between the pair of electrodes, the organic layer comprising a titanium oxide derivative layer consisting of a titanium oxide derivative represented by Formulae 1 through 4 and an organic material, $$Ti(OR_1)_4 \quad (1)$$

where $R_1$ is each independently $CH_3CO—CH=CCH_3—$, $C_2H_5OCO—CH=CCH_3—$, $—CH_3CH—COO^-NH_4^+$, $—COR_2$, or $—CO(C_6H_4)COOR_3$;
$R_2$ is a substituted or unsubstituted $C_1$-$C_{12}$ alkyl group; and
$R_3$ is a substituted or unsubstituted $C_1$-$C_{12}$ alkyl group;

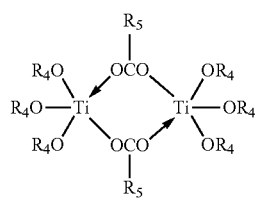
(2)

where $R_4$ is a substituted or unsubstituted $C_1$-$C_{12}$ alkyl group; and $R_5$ is a substituted or unsubstituted $C_1$-$C_{12}$ alkyl group;

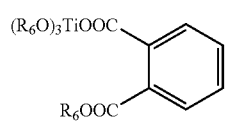
(3)

where $R_6$ is a substituted or unsubstituted $C_1$-$C_{12}$ alkyl group; and

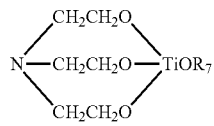
(4)

where $R_7$ is a substituted or unsubstituted $C_1$-$C_{12}$ alkyl group; and
the organic material is selected from the group consisting of copper phthalocyanine (CuPc); TCTA, m-MTDATA, IDE406, polyaniline/dodecylbenzenesulfonic acid (Pani/DBSA), or poly(3,4-ethylenedioxythiophene)/poly(4-styrenesulfonate) (PEDOT/PSS), 1,3,5-tricarbazolylbenzene, 4,4'-biscarbazolylbiphenyl, polyvinylcarbazole, m-biscarbazolylbenzene, 4,4'-biscarbazolyl-2,2'-dimethylbiphenyl, 4,4',4''-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'diamine (TPD), N,N'-di(naphthalene-1-yl)-N,N'-diphenyl benzidine (α-NPD), N,N'-diphenyl-N,N'-bis(1-naphthyl)-(1,1'-biphenyl)-4,4'-diamine (NPB), IDE320, poly(9,9-dioctylfluorene-co-N-(4-butylphenyl)diphenylamine) (TFB), poly(9,9-dioctylfluorene-co-bis-(4-butylphenyl-bis-N,N-phenyl-1,4-phenylenediamine)) (PFB), DCM1, DCM2, Eu(thenoyltrifluoroacetone)$_3$ (Eu (TTA)$_3$), dicyanomethylene-2-butyl-6-(1,1,7,7, -tetramethyljulolidyl-9-enyl)-4H-pyran (DCJTB), (tris-(8-hydroxyquinolinato)aluminum (Alq$_3$), rubrene, 4,4'-N-N'-dicarbazole-biphenyl (CBP), bis[2-(2'benzothienyl)-pyridinato -N,C$^3$]iridium (BTPIr), coumarin 6, C545T, quinacridone, Ir(ppy)$^3$, C314S, C343S, C7, C7S, C6S, C314T, C545T, C6, green 223, Bis-DAPOXP, Spiro-DPVBi, Spiro-6P, triarylamine compounds, 4,4'-bis(2,2-dinhenylvinyl)-1,1'-bipnhenyl (DPVBi), DSA, Compound(A), bis[2-(4,6-difluorophenyl)pyridinato-N,C$^2$] iridium picolinate (FIrpic), CzTT, anthracene, 1,1,4,4-tetraphenyl-1,3-butadiene (TPB), 3,5,3', 5'-tetrakis-tert-butyldiphenoquione; 1,2,3,4,5-pentaphenyl-1,3-cyclopentadiene (PPCP), DST, TPA, OXD-4, BBOT, AZM-Zn, BH-013X, IDE140, IDE105, bis(2-methyl-8-quinolato)-(p-phenylphenolato)-aluminum (Balq), bathocuproine (BCP), and tris(N-arylbenzimidazole) (TPBI), BaF$_2$, LiF, NaCl, CsF, Li$_2$O, BaO; and TCTA having a chemical structure of:

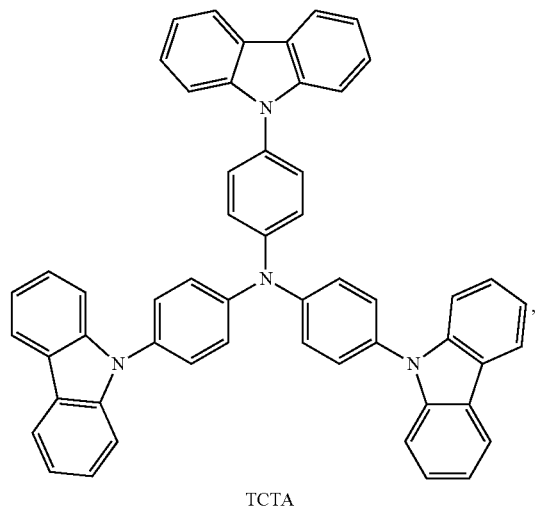

TCTA m-MTDATA having a chemical structure of:

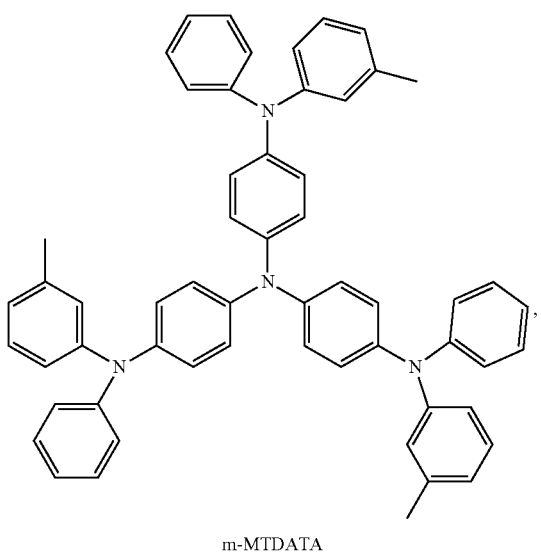

m-MTDATA rubrene having a chemical structure of:
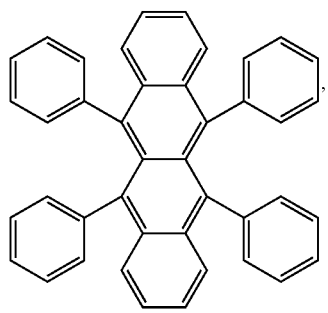
Ir(ppy)₃ having a chemical structure of:
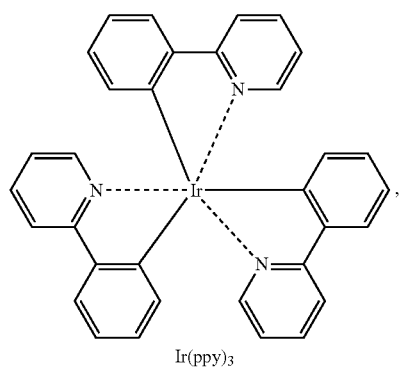
C314S having a chemical structure of:
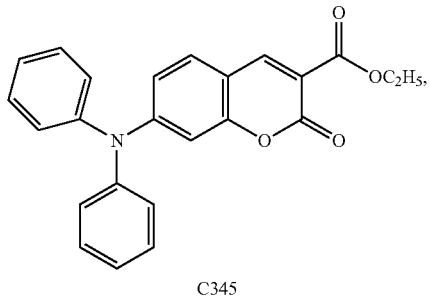
C343S having a chemical structure of:
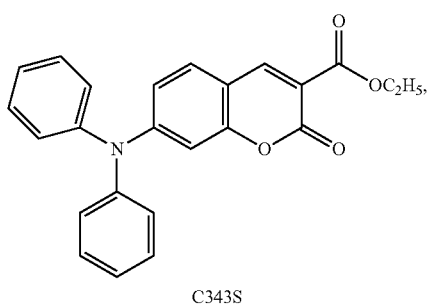
C7 having a chemical structure of:
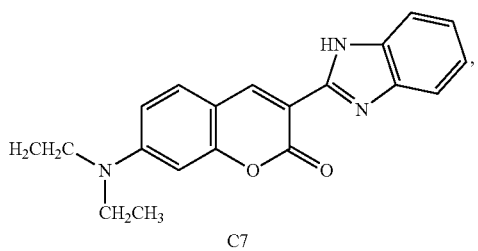
C7S having a chemical structure of:
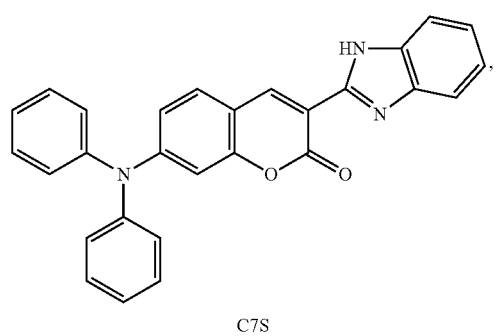
C6S having a chemical structure of:
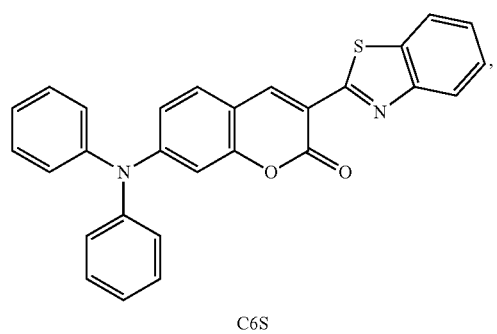
C314T having a chemical structure of:
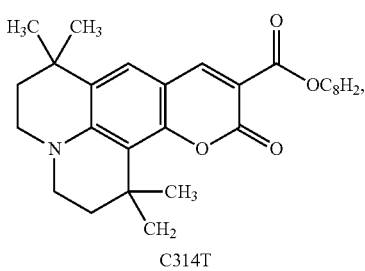

C545T having a chemical structure of:

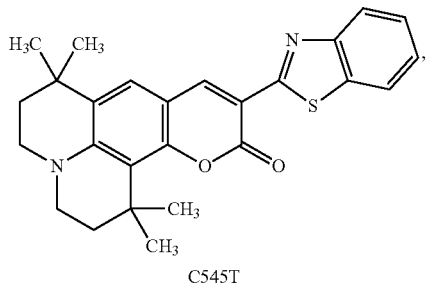
C545T

CzTT having a chemical structure of:

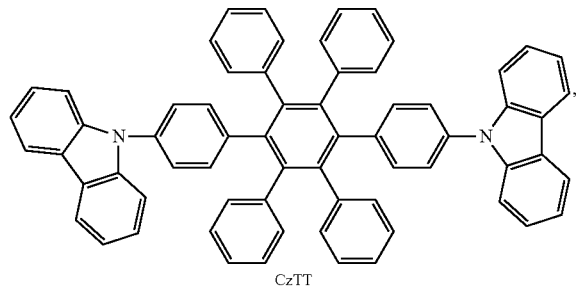
CzTT

Anthracene having a chemical structure of:

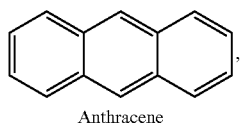
Anthracene

DST having a chemical structure of:

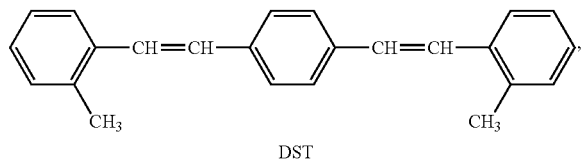
DST

TPA having a chemical structure of:

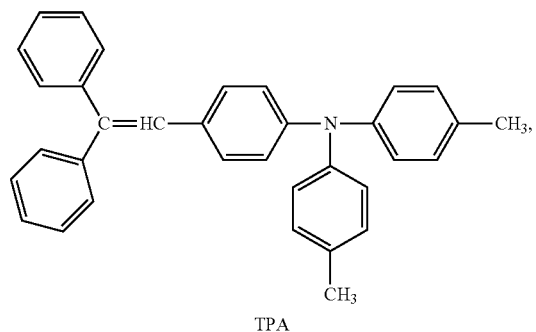
TPA

OXD-4 having a chemical structure of:

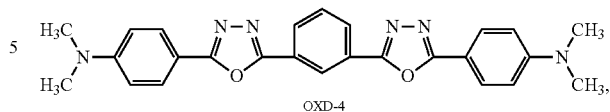
OXD-4

BBOT having a chemical structure of:

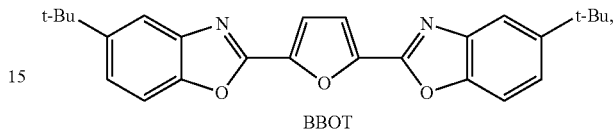
BBOT

AZM-Zn having a chemical structure of:

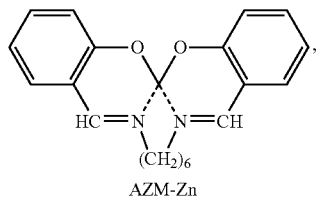
AZM-Zn

Spiro-DPVBi and Compound (A) having chemical structures of:

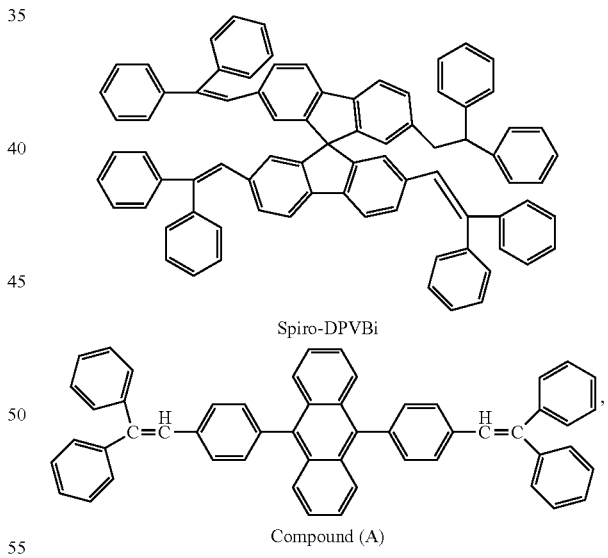
Spiro-DPVBi

Compound (A)

and a mixture thereof.

7. The organic electroluminescent device of claim 6, wherein the titanium oxide derivative layer is an electron transport layer.

8. The organic electroluminescent device of claim 6, wherein the titanium oxide derivative layer is formed using a solution of 1 wt % to 90 wt % of the titanium oxide derivative dissolved in a solvent selected from the group consisting of alcohols, aromatic groups, dimethyl formamid, acetone, and a mixture thereof.

9. The organic electroluminescent device of claim 6, wherein the titanium oxide derivative is represented by one of Formulae 2, through 4:

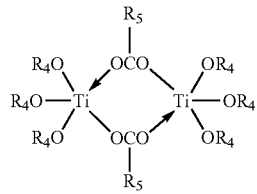
(2)

where $R_4$ is a substituted or unsubstituted $C_1$-$C_{12}$ alkyl group; and
$R_5$ is a substituted or unsubstituted $C_1$-$C_{12}$ alkyl group;

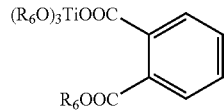
(3)

where $R_6$ is a substituted or unsubstituted $C_1$-$C_{12}$ alkyl group; and

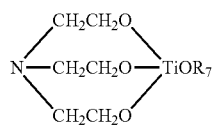
(4)

where $R_7$ is a substituted or unsubstituted $C_1$-$C_{12}$ alkyl group.

10. The organic electroluminescent device of claim 9, wherein the titanium oxide derivative is selected from the group consisting of acetylacetonate titanate chelate, ethyl acetoacetate titanate chelate, triethanolamine titanate chelate, lactic acid titanate chelate ammonium salt, and a mixture thereof.

11. The organic electroluminescent device of claim 6, wherein the titanium oxide derivative layer is an emissive layer.

12. The organic electroluminescent device of claim 11, wherein the emissive layer has a thickness ranging from 10 nm to 100 nm.

13. The organic electroluminescent device of claim 6, wherein the organic layer further comprises at least one layer selected from the group consisting of a hole injection layer, a hole transport layer, an emissive layer, and an electron transport layer.

14. The organic electroluminescent device of claim 13, wherein the organic layer further comprises at least one layer selected from the group consisting of a hole blocking layer, an electron injection layer, and an electron blocking layer.

15. An organic electroluminescent device, comprising:
a pair of electrodes; and
an organic layer interposed between the pair of electrodes;
a titanium oxide derivative layer consisting of 100% of a titanium oxide derivative represented by Formulae 1 through 4

$Ti(OR_1)_4$ (1)

where $R_1$ is each independently $CH_3CO-CH=CCH_3-$, $C_2H_5OCO-CH=CCH_3-$, $-CH_3CH-COO^-NH4^+$, $-COR_2$, or $-CO(C_6H_4)COOR_3$ or a $C_1$-$C_{12}$ alkyl group;
$R_2$ is a substituted or unsubstituted $C_1$-$C_{12}$ alkyl group; and
$R_3$ is a substituted or unsubstituted $C_1$-$C_{12}$ alkyl group;

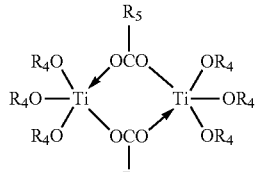
(2)

where $R_4$ is a substituted or unsubstituted $C_1$-$C_{12}$ alkyl group; and $R_5$ is a substituted or unsubstituted $C_1$-$C_{12}$ alkyl group;

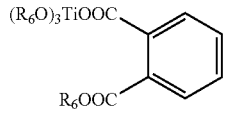
(3)

where $R_6$ is a substituted or unsubstituted $C_1$-$C_{12}$ alkyl group; and

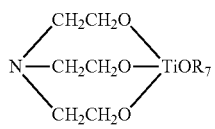
(4)

where $R_7$ is a substituted or unsubstituted $C_1$-$C_{12}$ alkyl group.

16. The organic electroluminescent device of claim 15, wherein the organic layer comprises:
at least one layer selected from the group consisting of a hole injection layer, a hole transport layer, an emission layer, and an electron transport layer; and
the titanium oxide derivative layer formed on said one layer.

17. The organic electroluminescent device of claim 15, wherein the titanium oxide derivative is selected from the group consisting of tetraisopropyl titanate, tetra-n-butyl titanate, tetrakis(2-ethylhexyl)titanate, acetylacetonate titanate chelate, ethyl acetoacetate titanate chelate, triethanolamine titanate chelate, lactic acid titanate chelate ammonium salt, and a mixture thereof.

18. The organic electroluminescent device of claim 15, wherein the titanium oxide derivative layer is formed using a solution of 1 wt % to 90 wt % of the titanium oxide derivative dissolved in a solvent selected from the group consisting of alcohols, aromatic groups, dimethyl formamid, acetone, and a mixture thereof.

* * * * *